US010311853B2

(12) United States Patent
Satoh et al.

(10) Patent No.: US 10,311,853 B2
(45) Date of Patent: Jun. 4, 2019

(54) PIEZOELECTRIC SOUNDING BODY

(71) Applicant: TDK Corporation, Minato-ku, Tokyo (JP)

(72) Inventors: Akira Satoh, Tokyo (JP); Kaoru Kijima, Tokyo (JP)

(73) Assignee: TDK CORPORATION, Tokyo (JP)

( * ) Notice: Subject to any disclaimer, the term of this patent is extended or adjusted under 35 U.S.C. 154(b) by 244 days.

(21) Appl. No.: 15/234,825

(22) Filed: Aug. 11, 2016

(65) Prior Publication Data

US 2017/0047504 A1 Feb. 16, 2017

(30) Foreign Application Priority Data

Aug. 11, 2015 (JP) ................................ 2015-159036

(51) Int. Cl.
*H01L 41/053* (2006.01)
*G10K 9/122* (2006.01)
*G10K 9/22* (2006.01)

(52) U.S. Cl.
CPC ............... *G10K 9/122* (2013.01); *G10K 9/22* (2013.01)

(58) Field of Classification Search
CPC ................................ G10K 9/122; G10K 9/22
USPC .................................................. 310/340, 348
See application file for complete search history.

(56) References Cited

U.S. PATENT DOCUMENTS

2004/0124748 A1 7/2004 Takeshima et al.

FOREIGN PATENT DOCUMENTS

| | | | | | |
|---|---|---|---|---|---|
| CN | 202353770 | U | | 7/2012 | |
| JP | H11-052958 | A | | 2/1999 | |
| JP | 2000-333296 | A | | 11/2000 | |
| JP | 3861809 | B2 | | 12/2006 | |
| JP | 2015--597292 | A | * | 3/2015 | ............ G04G 17/02 |

OTHER PUBLICATIONS

Japanese Office Action of related Japanese Patent Application No. 2015-159036 dated Sep. 5, 2017.

* cited by examiner

*Primary Examiner* — Thomas M Dougherty
(74) *Attorney, Agent, or Firm* — Arent Fox LLP

(57) ABSTRACT

A piezoelectric sounding body includes: a piezoelectric vibrating plate; a case housing the piezoelectric vibrating plate; a first conductive terminal electrically connected to one electrode in the piezoelectric vibrating plate; and a second conductive terminal electrically connected to the other electrode in the piezoelectric vibrating plate. The case includes: a lower case where the first conductive terminal and the second conductive terminal are fixed; and an upper case configured to be fixed in a caulking manner to the lower case and to sandwich the piezoelectric vibrating plate between the upper case and the lower case.

7 Claims, 8 Drawing Sheets

PIEZOELECTRIC SOUNDING BODY

CROSS-REFERENCE TO RELATED APPLICATIONS

This application claims priority to Japanese Application No. 2015-159036, filed Aug. 11, 2015. The disclosure of the priority application is incorporated in its entirety herein by reference.

BACKGROUND OF THE INVENTION

1. Field of the Invention

The present invention relates to a piezoelectric sounding body that generates a certain sound by vibration of a piezoelectric vibrating plate.

2. Description of the Related Art

For example, in the likes of an automobile or various kinds of household electrical appliances, a piezoelectric sounding body is sometimes adopted as a sounding body that generates a buzzer sound or the like. The piezoelectric sounding body applies a cyclical voltage signal to a piezoelectric vibrating plate, thereby vibrating the piezoelectric vibrating plate and generating a specific sound (for example, a warning sound, and so on) that attracts the attention of a user, or the like.

In a conventional a piezoelectric sounding body, a case housing the piezoelectric vibrating plate mainly consists of two members of a case body and a lid member, and the piezoelectric vibrating is sandwiched between the case body and the lid member. As a technique for fixing the case body and the lid member, a technique for engaging the case body and the lid member, a technique for bonding the case body and the lid member, and the like are disclosed (see Patent Documents 1 and 2).

Patent Document 1: JP H11-52958 A

Patent Document 2: Japanese Patent No. 3861809

SUMMARY OF THE INVENTION

The conventional techniques for engaging the case body and the lid member to fix them have problems in reliability because an engagement state between the case body and the lid member is subject to be affected by the external environment, and a fixed state of the piezoelectric vibrating plate sandwiched by the case body and the lid member may be affected by vibration and varied. As with the case of engaging the case body and the lid member to fix them, the conventional techniques for bonding the case body and the lid member to fix them have problems because a fixed state between the case body and the lid member may be affected by the external environment and varied as time goes by.

The present invention has been made in view of such circumstances, it is an object of the invention to provide a piezoelectric sounding body having a holding state that is hardly varied due to influence of the external environment and a high reliability.

In order to achieve the above object, a piezoelectric sounding body according to the present invention comprises:

a piezoelectric vibrating plate;

a case housing the piezoelectric vibrating plate;

a first conductive terminal electrically connected to one electrode in the piezoelectric vibrating plate; and a second conductive terminal electrically connected to the other electrode in the piezoelectric vibrating plate, wherein the case includes:

a lower case where the first conductive terminal and the second conductive terminal are fixed; and an upper case configured to be fixed in a caulking manner to the lower case and to sandwich the piezoelectric vibrating plate between the upper case and the lower case, and the upper case includes:

a contact projection configured to contact the piezoelectric vibrating plate and to press it toward the lower case; and an upper case lower surface configured to face the piezoelectric vibrating plate or the lower case with respect to a pressing direction where the piezoelectric vibrating plate is pressed toward the lower case and be arranged with space to the piezoelectric vibrating plate or the lower case.

In the piezoelectric sounding body configured to fix the upper case and the lower case in a caulking manner, the piezoelectric vibrating plate has a holding state that is hardly varied by influence of the external environment, and the piezoelectric vibrating plate can be securely held by being sandwiched between the upper case and the lower case. Also, the contact projection of the upper case presses the piezoelectric vibrating plate toward the lower case, and the upper case lower surface is positioned with space to the piezoelectric vibrating plate or the lower case, which can prevent space from occurring between the contact projection and the piezoelectric vibrating plate, and improve sealing property of the contact portion between the contact projection and the piezoelectric vibrating plate.

For example, a sealing resin may be arranged on a contact portion between the piezoelectric vibrating plate and the contact projection.

This sealing resin can prevent space from occurring between the contact projection and the piezoelectric vibrating plate and improve sealing property of the contact portion.

For example, a plurality of insertion holes where a caulking projection for fixing the upper case in a caulking manner to the lower case is inserted may be formed in the upper case and have a lower opening positioned on the upper case lower surface.

The lower opening of the insertion hole inserted by the caulking projection is formed on the upper case lower surface positioned with space to the lower case, which allows a fixing force of the caulking fixing to preferably act to press the piezoelectric vibrating plate toward the lower case due to the contact projection, and can improve sealing property of the contact portion between the contact projection and the piezoelectric vibrating plate.

For example, the contact projection may extend along a circumferential direction of the piezoelectric vibrating plate and the insertion hole may be positioned farther than the contact protrusion with respect to a center of the piezoelectric vibrating plate.

The insertion hole inserted by the caulking projection is positioned outside the contact projection extending along the circumferential direction of the piezoelectric vibrating plate. This allows a fixing force of the caulking fixing to preferably act on the contact projection of the upper case in a direction where the piezoelectric vibrating plate is pressed, and improve sealing property of the contact portion between the contact projection and the piezoelectric vibrating plate.

For example, the upper case lower surface may include: a first upper case lower surface configured to have part of an opening edge of the lower opening; and a second upper case lower surface configured to have another part of the opening edge, to be positioned farther from the contact projection than the first upper case lower surface, and to have the space being narrower than that of the first upper case lower surface.

The first upper case lower surface near the contact projection is configured to have a large space to the piezoelectric vibrating plate or the lower case, and the second upper case lower surface far from the contact projection is configured to have a small space to the lower case etc. This can prevent a three applied to the contact portion from locally being too large while improving sealing property of the contact portion between the contact-point part and the piezoelectric vibrating plate.

DESCRIPTION OF THE PREFERRED EMBODIMENTS

Figure 1:
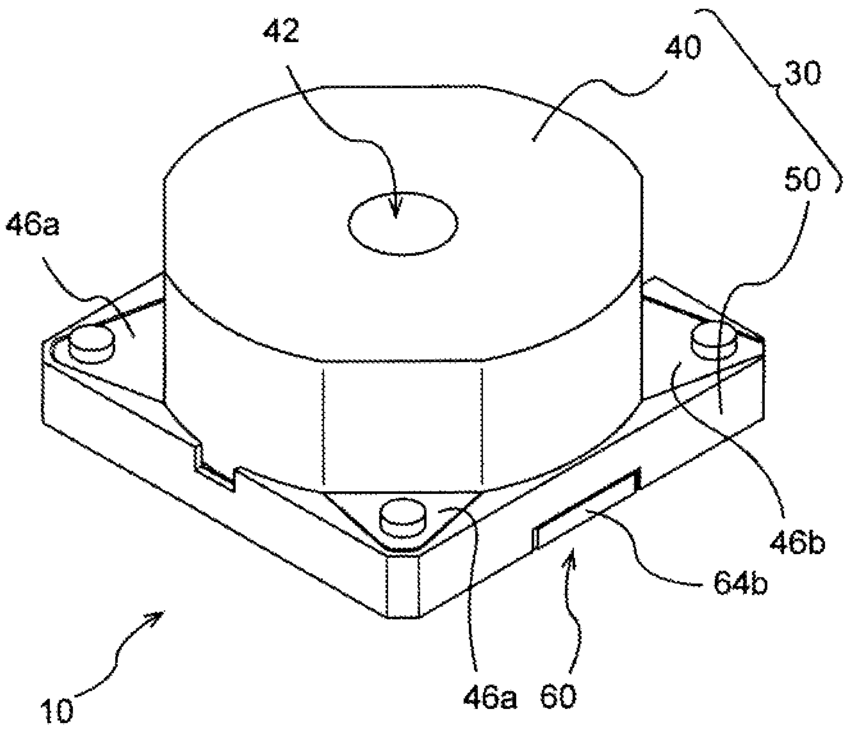
FIG. 1 is a schematic view of a piezoelectric sounding body according to an embodiment of the present invention.

The present invention will be described below based on an embodiment shown in the drawings.

FIG. 1 is a schematic perspective view of a piezoelectric sounding body 10 according to an embodiment of the present invention. As shown in FIG. 1, the piezoelectric sounding body 10 includes a case 30 configured by an upper case 40 and a lower case 50. The case 30 houses a piezoelectric vibrating plate 20 shown in FIG. 2 and a first conductive terminal 60 and a second conductive terminal 70 that are electrically connected to electrodes of the piezoelectric vibrating plate 20. As shown in FIG. 1, other parts of the first conductive terminal 60 and the second conductive terminal 70 are exposed to the outside of the case 30.

Figure 2:
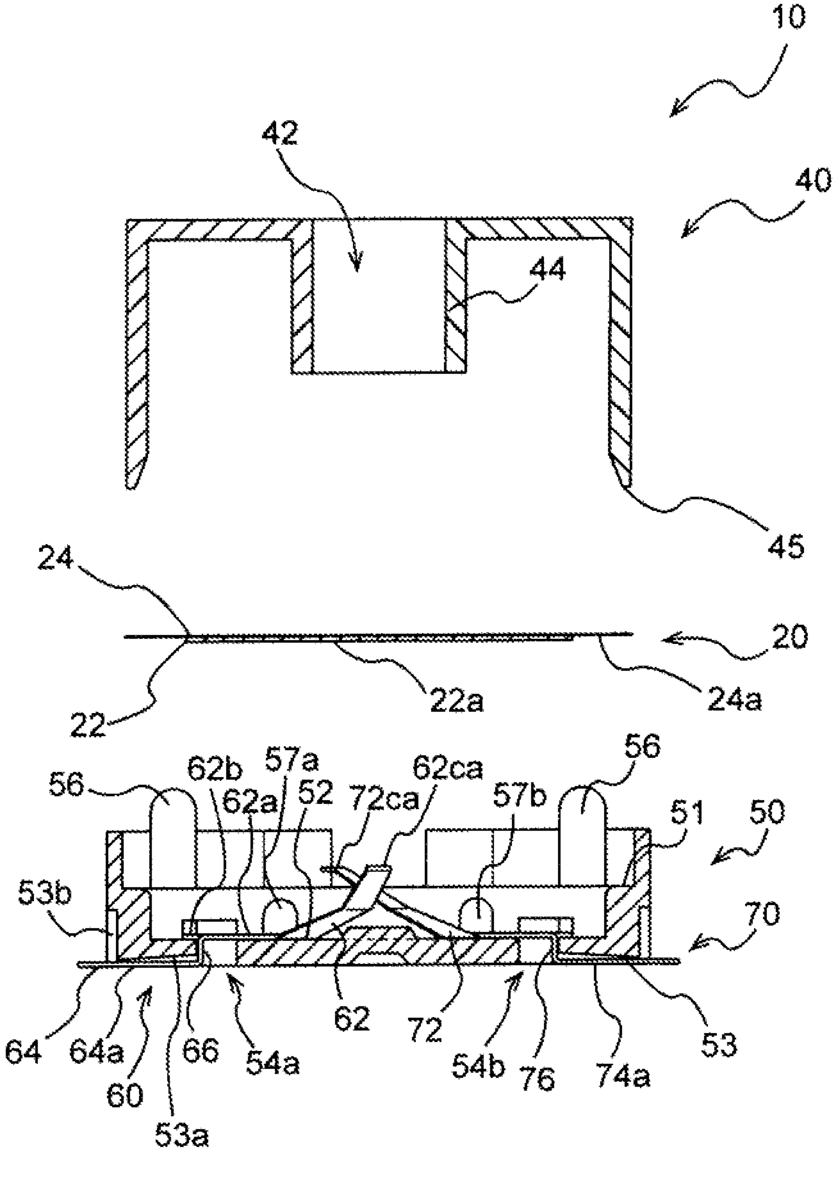
FIG. 2 is an exploded cross-sectional view of the piezoelectric sounding body shown in FIG. 1.

FIG. 2 is an exploded cross-sectional view of the piezoelectric sounding body 10 shown in FIG. 1. The piezoelectric vibrating plate 20 has an outer shape of circular plate. The piezoelectric vibrating plate 20 has a two-layer structure in which a piezoelectric body 22 and a vibrating plate 24 both having a circular plate shape are concentrically stacked, and the vibrating plate 24 arranged upwardly has a larger diameter than the piezoelectric body 22 arranged downwardly. A vibrating plate outer circumferential portion 24*a* of the vibrating plate 24 is an outside portion of an outer periphery of the piezoelectric body 22 and is placed on a lower case step part 51.

The vibrating plate 24 functions as one electrode of the piezoelectric vibrating plate 20. The other electrode 22*a* of the piezoelectric vibrating plate 20 is formed on a lower surface of the piezoelectric body 22. Moreover, the vibrating plate 24 as one electrode and the other electrode 22*a* are insulated, and a voltage is applied to the piezoelectric body 22 via the vibrating plate 24 and the other electrode 22*a*. The piezoelectric body 22 is made of any material with an electrode formed on a piezoelectric material, and is configured, for example, by forming the electrode 22*a*, such as Ag, on the likes of ferroelectric ceramics, such as PZT (lead zirconate titanate). The vibrating plate 24 is also made of any material, such as metal material of brass, Ni alloy, or the like. Note that the vibrating plate 24 may be joined to the piezoelectric body 22 via a base electrode, such as Ag, formed on the surface of the piezoelectric body 22.

As shown in FIG. 1 and FIG. 2, the upper case 40 has a substantially hollow cylindrical outer shape where a sound emitting hole 42 is formed on its upper center. As shown in FIG. 2, an edge part of the sound emitting hole 42 configures a cylindrical part 44 protruding downwardly, and the cylindrical part 44 is arranged inside the upper case 40. An opening diameter of the sound emitting hole 42 or protrusion length of the cylindrical part 44 is properly adjusted based on the likes of a pitch of sound generated by the piezoelectric sounding body 10.

The upper case 40 has any diameter of its periphery, such as about 10 to 30 mm. Moreover, the upper case 40 has also any height, such as about 3 to 15 mm.

As shown in FIG. 2, a contact projection 45 (see FIG. 1) is formed in the circumferential direction of the lower end of the upper case 40. The contact projection 45 extends along the circumferential direction of the piezoelectric vibrating plate 20, and has a ring shape as seen from below.

Figure 7:
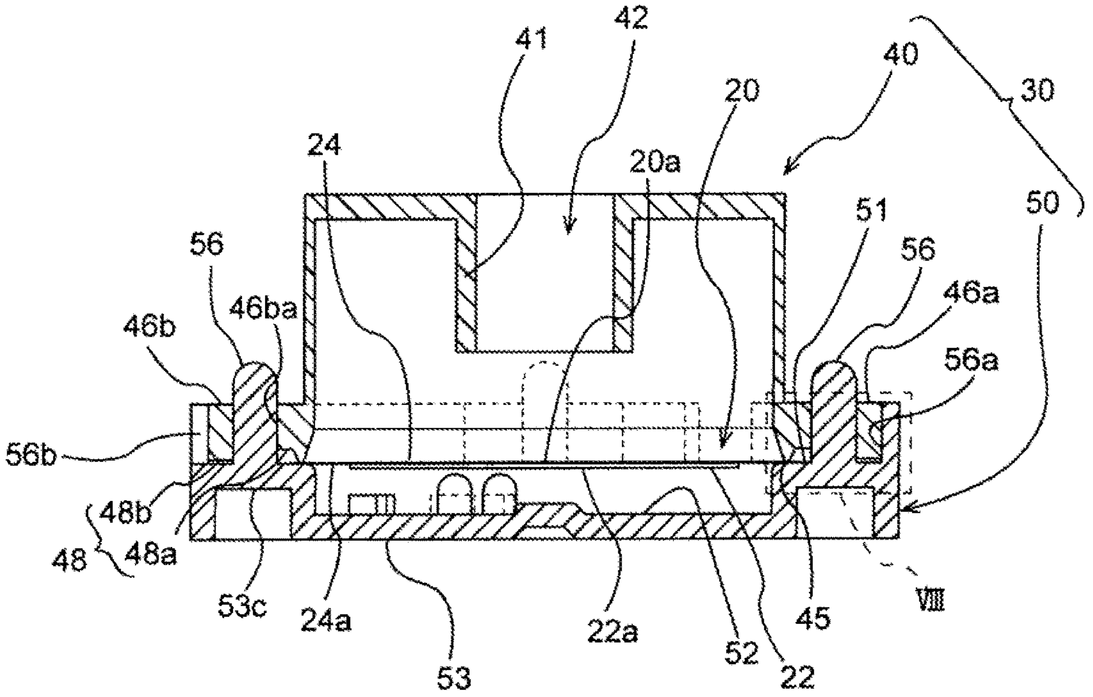
FIG. 7 is a cross-sectional view showing an assembled state of an upper case, a piezoelectric vibrating plate, and the lower case.

As shown in FIG. 7, which displays an assembled state of the upper case 40, the lower case 50, and the piezoelectric vibrating plate 20, the contact projection 45 of the upper case 40 contacts the vibrating plate outer circumferential portion 24*a* of the piezoelectric vibrating plate 20. The contact projection 45 presses the vibrating plate outer circumferential portion 24*a* toward the lower case step part 51 formed on the lower case 50 to fix it to the case 30. That is, the piezoelectric vibrating plate 20 is sandwiched between the contact projection 45 and the lower case step part 51 and held by the upper case 40 and the lower case 50. Note that FIG. 7 does not illustrate the first conductive terminal 60 or the second conductive terminal 70 shown in FIG. 2.

Engaging parts 46*a* and 46*b* projecting toward the outer diameter direction are formed at four places in an outer periphery of the upper case 40 (see FIG. 1). As shown in FIG. 7, insertion holes 46*aa* and 46*ba* for inserting case caulking projections 56 provided on the lower case 50 are formed in the respective engaging parts 46*a* and 46*b*. The upper case 40 is fixed to the lower case 50 due to caulking by inserting the case caulking projections 56 into the insertion holes 46*aa* and 46*ba* of the engaging parts 46*a* and 46*b*. The insertion holes 46*aa* and 46*ba* are positioned farther to a center 20*a* of the piezoelectric vibrating plate 20 than the contact projection 45. Note that a state where the upper case 40 and the lower case 50 are fixed will be explained in detail below.

Figure 4:
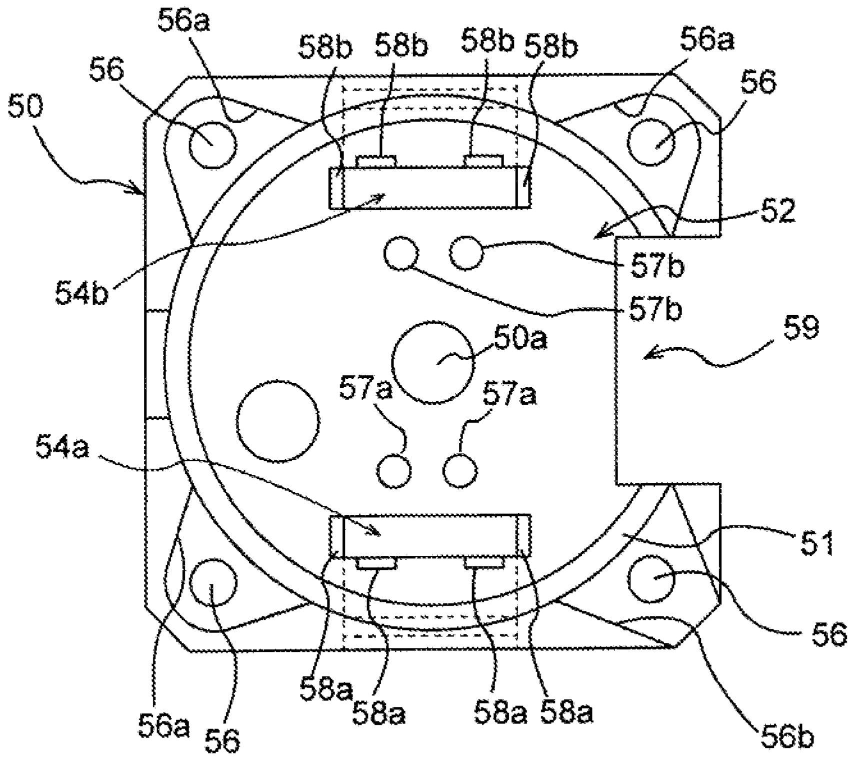
FIG. 4 is a plan view showing the lower case prior to assembly used for the piezoelectric sounding body shown in FIG. 1.

FIG. 4 is a plan view of the lower case 50. As shown in FIG. 4, the lower case 50 has a substantially rectangular outer shape when viewed from above. The lower case step part 51 where the vibrating plate outer circumferential portion 24*a*, which is the outer circumferential portion of the piezoelectric vibrating plate 20, is arranged is formed on the lower case 50. The lower case step part 51 is formed along the circumferential direction of the upper case 40, and has a planer shape corresponding to a shape of the contact projection 45 of the upper case 40. Note that, as shown in FIG. 4, the lower case step part 51 is divided by a notch 59 formed in the lower case 50, and hence is not continuous in the circumferential direction. The notch 59 is an air hole provided for being able to appropriately generate sound by the piezoelectric sounding body 10. This air hole has any shape and is positioned anywhere.

As shown in FIG. 4, the four corners of the lower case 50 are provided with the case caulking projections 56 for fixing the upper case 40 to the lower case 50 in a caulking manner. The case caulking projections 56 project upwardly. As shown in FIG. 7, the lower case step part 51 where the piezoelectric vibrating plate 20 is placed is continuous to base portions of the case caulking projections 56. A projection lower recess 53*c* for preventing warp of the lower case 50 is formed on back side of the case caulking projections 56.

As shown in FIG. 4, guide parts 56*a* and 56*b* engaged with the engaging parts 46*a* and 46*b* of the upper case 40 are formed on the periphery of the four case caulking projections 56. The engaging parts 46*a* and 46*b* of the upper case 40 and the guide parts 56*a* and 56*b* of the lower case 50 have a lateral shape corresponding to each other. The upper case 40 and the lower case 50 are combined in a correct position, so that the engaging parts 46*a* and 46*b* of the upper case 40 are engaged with the guide parts 56*a* and 56*b* of the lower case 50, and the case caulking projections 56 of the lower case 50 are inserted through the insertion holes 46*aa* and 46*ba* formed in the engaging parts 46*a* and 46*b* of the upper case 40 (see FIG. 7).

At least one pair of the guide part 56*b* and the engaging part 46*b* of the corresponding four pairs of the guide parts 56*a* and 56*b* and the engaging parts 46*a* and 46*b* have a different shape from the other guide parts 56*a* and engaging parts 46*a*. This prevents the engaging parts 46*a* and 46*b* from engaging with the guide parts 56*a* and 56*b* when attempting to combine the upper case 40 and the lower case 50 in an incorrect position (see FIG. 4 and FIG. 7).

Figure 8:
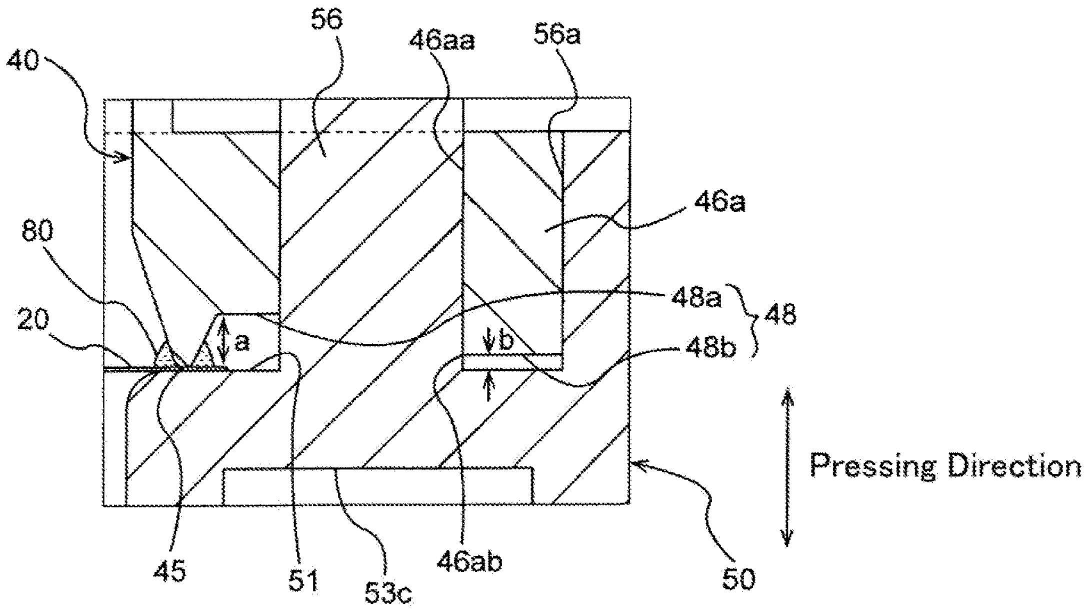
FIG. 8 is a partial enlarged cross-sectional view.

FIG. 8 is an enlarged cross-sectional view where a fixed portion of the upper case 40 and the lower case 50 is enlarged. The upper case 40 has an upper case lower surface 48 positioned with space to the piezoelectric vibrating plate 20 or the lower case 50 with respect to a pressing direction where the piezoelectric vibrating plate 20 is pressed toward the lower case 50. A lower opening 46*ab* of the insertion hole 46*aa* where the case caulking projection 56 is inserted is arranged on an upper case lower surface 48. Thus, there is a predetermined space is between the lower case step part 51 where the base of the case caulking projection 56 is connected and the upper case lower surface 48 where the lower opening 46*ab* of the insertion hole 46*aa* is located.

As shown in FIG. 8, the upper case lower surface 48 has a first upper case lower surface 48*a* and a second upper case lower surface 48*b*, both of which respectively have different space to the lower case 50 with respect to the pressing direction. The lower opening 46*ab* of the insertion hole 46*aa* is positioned to cross the first upper case lower surface 48*a* and the second upper case lower surface 48*b*. Thus, the first upper case lower surface 48*a* has part of an opening edge of the lower opening 46*ab*, and the second upper case lower surface 48*b* has another part of the opening edge of the lower opening 46*ab*.

The second upper case lower surface 48*b* is positioned farther from the contact projection 45 compared with the first upper case lower surface 48*a*. Moreover, the space "b" between the second upper case lower surface 48*b* and the lower case step part 51 is smaller than the space "a" between the first upper case lower surface 48*a* and the piezoelectric vibrating plate 20 (the lower case step part 51 when the piezoelectric vibrating plate 20 does not face the first upper case lower surface 48*a*).

As shown in FIG. 4, a first terminal insertion hole 54*a* and a second terminal insertion bole 54*b* are formed on the bottom surface of the lower case 50. The first conductive terminal 60 (see FIG. 2 and FIG. 5A) passes through the first terminal insertion hole 54*a*. The second conductive terminal 70 (see FIG. 2 and FIG. 5B) passes through the second terminal insertion hole 54*b*. The first terminal insertion hole 54*a* and the second terminal insertion hole 54*b* penetrate the lower case 50 front a lower case inner wall surface 52 to a lower case outer wall surface 53, which is an outer wan surface of the lower case 50 (see FIG. 2).

A plurality (two in the embodiment) of the terminal caulking projections 57*a* for fixing the first conductive terminal 60 to the lower case 50 is formed on the lower case inner wall surface 52. Moreover, a plurality of (four in the embodiment) auxiliary caulking projections 58*a* is formed on an opening edge of the first terminal insertion hole 54*a*. The auxiliary caulking projections 58*a* in conjunction with the terminal caulking projections 57*a* the first conductive terminal 60 to the lower case 50.

A terminal caulking projections 57*b* and an auxiliary caulking projection 58*b*, both of which are for fixing the second conductive terminal 70 to the lower case 50, are formed on the lower case inner wall surface 52. The auxiliary caulking projection 58*b* is formed along an opening edge of the second terminal insertion hole 54*b*. The number of the terminal caulking projections 57*b* and the auxiliary caulking projections 58*b* for fixing the second conductive terminal 70 is the same as the number of the terminal caulking projections 57*a* and the auxiliary caulking projections 58*a* for fixing the first conductive terminal 60. However, the number of the terminal caulking projections 57*a* and 57*b* and the auxiliary caulking projections 58*a* and 58*b* is not limited to the number shown in the embodiment.

The upper case 40 and the lower case 50 can be manufactured by a resin material, such as a liquid crystal polyester resin, a phenol resin, and a polybutylene terephthalate resin. The upper case 40 and the lower case 50 are preferably manufactured by a heat resistant resin so as to be able to endure a thermal load during surface mounting, but are not limited.

As shown in FIG. 2, the first conductive terminal 60 has a first terminal portion 62, a second terminal portion 64, and a third terminal portion 66. The first terminal portion 62 is arranged inside the case 30 shown in FIG. 1. The second terminal portion 64 is arranged outside the case 30. The third terminal portion 66 is arranged in the first terminal insertion hole 54*a* formed in the lower case 50 of the case 30 to connect the first terminal portion 62 and the second terminal portion 64.

Figure 3:
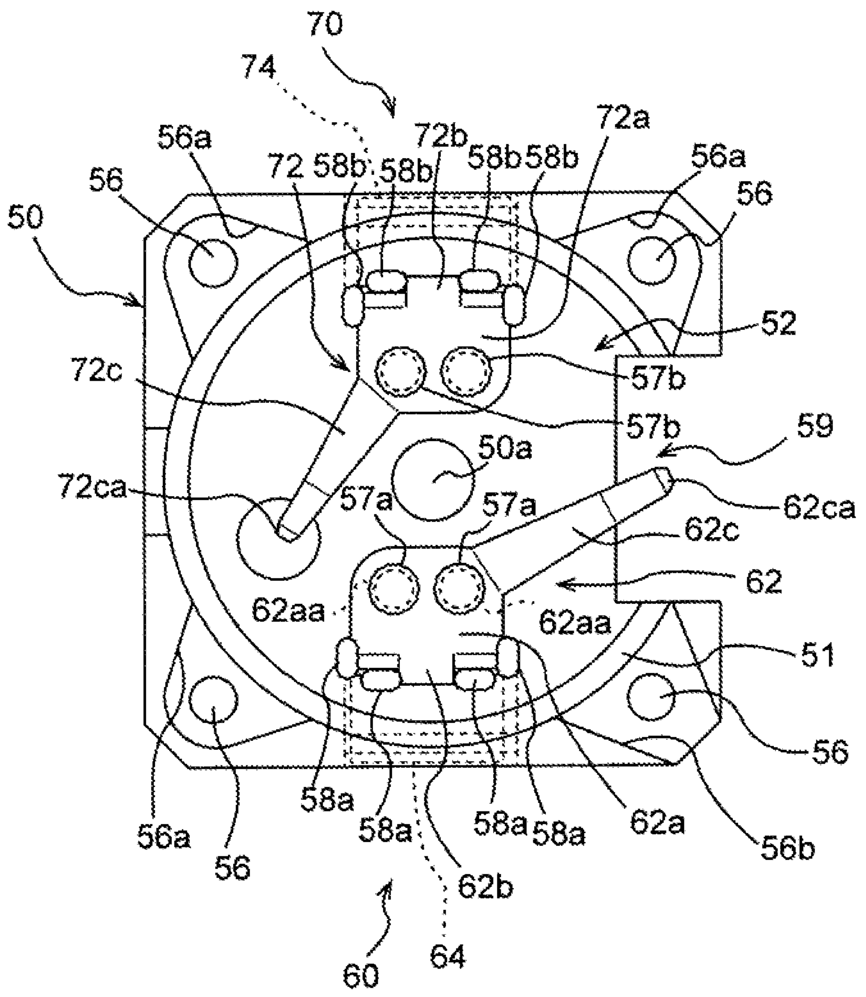
FIG. 3 is a schematic plan view showing a state of a lower case and a conductive terminal of the piezoelectric sounding body shown in FIG. 1 as seen from above.

In an assembled state where the piezoelectric vibrating plate 20 is fixed to the lower case step part 51 (see FIG. 7), a terminal edge 62*ca* of the first conductive terminal 60 is electrically connected to the vibrating plate 24, which is one electrode of the piezoelectric vibrating plate 20. FIG. 3 shows a state where the first conductive terminal 60 and the second conductive terminal 70 are fixed to the lower case 50. The terminal edge 62*ca* of the first conductive terminal 60 is connected to the vibrating plate outer circumferential portion 24*a* of the piezoelectric vibrating plate 20 where the vibrating plate 24 is visible from below. The terminal edge 62*ca* is fixed to the vibrating plate 24 using the likes of a conductive adhesive agent, for example, but the piezoelectric vibrating plate 20 and the first conductive terminal 60 are connected by any method.

Figure 5A:
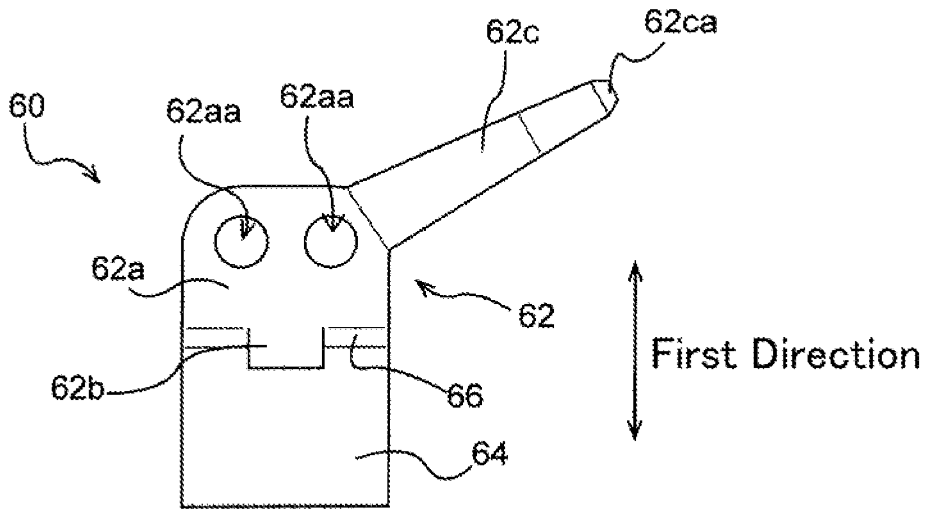
FIG. 5A is a plan view showing a first conductive terminal used for the piezoelectric sounding body shown in FIG. 1.
Figure 6:
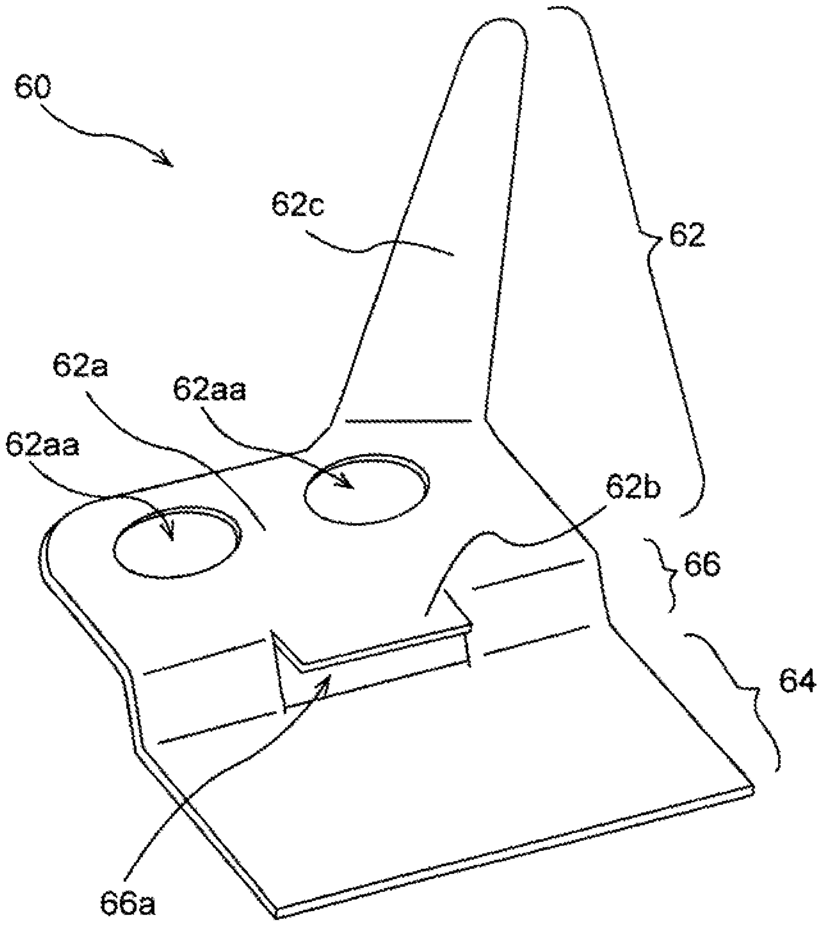
FIG. 6 is a schematic perspective view of the first conductive terminal shown in FIG. 5A.

FIG. 5A is a plan view of the first conductive terminal 60. The first terminal portion 62 of the first conductive terminal 60 has a contacting part 62*a*, a sandwiching portion 62*b*, and a contact-point part 62*c*. As shown in FIG. 2 and FIG. 6, the contacting part 62*a* extends in the same plane as the sandwiching portion 62*b*. As shown in FIG. 5A, a plurality (two in the embodiment) of fixing holes 62*aa* for inserting the terminal caulking projections 57*a* of the lower case 50 is formed on the contacting part 62*a*. As shown in FIG. 2 and FIG. 3, the contacting part 62*a* is fixed in a caulking manner by the terminal caulking projections 57*a* and the auxiliary caulking projections 58*a* so as to contact the lower case inner wall surface 52, which is an inner wall surface of the lower case 50.

Figure 5B:
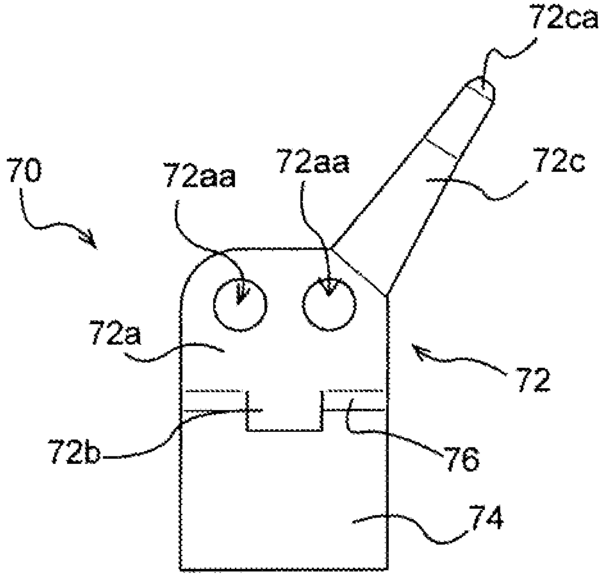
FIG. 5B is a plan view showing a second conductive terminal used for the piezoelectric sounding body shown in FIG. 1.

As shown in FIG. 3, FIG. 5A, and FIG. 5B, the sandwiching portion 62*b* of the first terminal portion 62 is connected to one side of the contacting part 62*a*, is smaller than the contacting part 62*a*, and has a rectangular plate like outer shape. As shown in FIG. 3, the auxiliary caulking projections 58*a* may fix the sandwiching portion 62*b* in addition to the contacting part 62*a* of the first terminal portion 62 to the lower case 50 in a caulking manner.

As shown in FIG. 2, the second terminal portion 64 is arranged on the lower case outer wall surface 53. At least part of the second terminal portion 64 contacts the lower case outer wall surface 53, and the sandwiching portion 62*b* contacting the lower case inner wall surface 52 sandwiches part of the lower case 50 between itself and the second terminal portion 64.

As shown in FIG. 2, the contact-point part 62*c* extends upwardly with respect to a plane in which the contacting part 62*a* and the sandwiching portion 62*b* are arranged. As shown in FIG. 5, a base end of the contact-point part 62*c* is connected to the contacting part 62*a*, and the terminal tip 62*ca*, which is a tip of the contact-point part 62*c*, is fixed to the piezoelectric vibrating plate 20 shown in FIG. 2. Thus, the contact point part 62*c* connects the contacting part 62*a* and the piezoelectric vibrating plate 20.

As shown in FIG. 2 and FIG. 5, a bend portion is formed at two places in the contact-point part 62*c*. Moreover, as shown in FIG. 2, in the fast terminal portion 62, when an arrangement direction of the sandwiching portion 62*b* and the contacting part 62*a* is assumed to be a first direction and the first terminal portion 62 is viewed in plane from a normal direction to a placement surface of the sandwiching portion 62*b* and the contacting part 62*a*, the contact-point part 62*c* extends in a direction intersecting the first direction. Furthermore, the contact-point part 62*c* has a shape that narrows from its base end on a side of the contacting part 62*a* to the terminal tip 62*ca* on a side of the piezoelectric vibrating plate 20.

As shown in FIG. 6, the third terminal portion 66 is connected to the contacting part 62*a* of the first terminal portion 62. The third terminal portion 66 is connected to the same side of the contacting part 62*a* as the side where the sandwiching portion 62*b* is connected to the contacting part 62*a*, but the third terminal portion 66 is bent downwardly with respect to the contacting part 62*a*, whereas the sandwiching portion 62*b* is arranged in the same plane as the contacting part 62*a*.

As shown in FIG. 6, a through hole 66*a* corresponding to a shape of the sandwiching portion 62*b* is formed on the third terminal portion 66. Note that an entirety of the through hole 66*a* may be formed in the third terminal portion 66, and that part of the through hole 66*a* may be continuous to the second terminal portion 64. The third terminal portion 66 connects the first terminal portion 62 and the second terminal portion 64. As shown in FIG. 2, the third terminal portion 66 is positioned in the first terminal insertion hole 54*a* of the lower case 50.

As shown in FIG. 2, a downside part 64*a* of the second terminal portion 64 bent to connect to the third terminal portion 66 is parallel to the sandwiching portion 62*b*, and at least part of the downside part 64*a* contacts the lower case outer wall surface 53. As shown by the dotted lines in FIG. 4, a downside recess 53*a* is formed on a surface facing downwardly of the lower case outer wall surface 53, and the downside part 64*a* of the third terminal portion 66 is arranged in the downside recess 53*a*.

An end on an opposite side to a side connected to the third terminal portion 66 in the second terminal portion 64 is bent upwardly from the state shown in FIG. 2 and configures a lateral part 64*b* as shown in FIG. 1. As shown in FIG. 2, a lateral recess 53*b* is formed on a surface facing laterally of the lower case outer wall surface 53, and, the lateral part 64*b* of the third terminal portion 66 is arranged on the lateral recess 53*b*. The lateral part 64*b* is substantially parallel to the third terminal portion 66 and sandwiches part of the lower case 50 between itself and the third terminal portion 66.

As shown in FIG. 2, the second conductive terminal 70, similarly to the first conductive terminal 60, also includes: a first terminal portion 72 arranged on the inside of the case 30; a second terminal portion 74 arranged on the outside of the case 30; and a third terminal portion 76 that connects the first terminal portion 72 and the second terminal portion 74 and is arranged in the second terminal insertion hole 54*b* formed in the lower case 50 of the case 30.

FIG. 5B is a plan view of the second conductive terminal 70. As understood from a comparison between FIG. 5A and FIG. 5B, the second conductive terminal 70 has common characteristics with the first conductive terminal 60 in many respects. Thus, the second conductive terminal 70 will be explained mainly in terms of differences from the first conductive terminal 60, and common points with the conductive terminal 60 will not be explained.

In the assembled state where the piezoelectric vibrating plate 20 is fixed to the lower case step part 51 (see FIG. 7), a terminal tip 72*ca* of the second conductive terminal 70 is electrically connected to the other electrode 22*a* of the piezoelectric vibrating plate 20. As shown in FIG. 3, the terminal tip 72*ca* of the second conductive terminal 70 is arranged nearer to the center 50*a* than the terminal tip 62*ca* of the first conductive terminal 60, and is connected to a portion of the piezoelectric vibrating plate 20 where the vibrating plate 24 is covered from below by the piezoelectric body 22. The terminal tip 72*ca* of the second conductive terminal 70 is fixed to the other electrode 22*a* using the likes of a conductive adhesive agent.

As shown in FIG. 5B, fixing holes 72*aa*, where the terminal caulking projections 57*a* of the lower case 50 are inserted, are also formed on the second conductive terminal 70, and the second conductive terminal 70 is also fixed in a caulking manner by the terminal caulking projections 57*b* and the auxiliary caulking projections 58*b* (see FIG. 3).

The first conductive terminal 60 and the second conductive terminal 70 may be produced using the likes of a good conductor metal, for example, phosphor bronze, but the first conductive terminal 60 and the second conductive terminal 70 are made of any material. Moreover, the first conductive terminal 60 and the second conductive terminal 70 may be applied with the likes of Au plating, Ni plating, or Sn plating.

The piezoelectric sounding body 10 shown in FIG. 1 is manufactured by the following steps, for example.

First, in a first step, the lower case 50 shown in FIG. 4 and the first conductive terminal 60 and second conductive terminal 70 shown in FIG. 5 are prepared, and the first conductive terminal 60 and the second conductive terminal 70 are attached to the lower case 50. Note that file upper case 40 and the lower case 50 are manufactured by resin molding such as injection molding, for example, and the first conductive terminal 60 and the second conductive terminal 70 are manufactured by mechanically processing a flat metal plate whose surface has been plated, for example.

Next, in a second step, the first conductive terminal 60 and the second conductive terminal 70 are fixed in a caulking manner to the lower case 50. Specifically, tips of the terminal caulking projections 57*a* and 57*b* of the lower case 50 are heated and thereby deformed so as to be larger than the fixing holes 62*aa* kind 72*aa* of the first conductive terminal 60 and the second conductive terminal 70. In addition, the auxiliary caulking projections 58*a* and 58*b* are heated and thereby deformed, such that as shown in FIG. 3, parts of the auxiliary caulking projections 58*a* and 58*b* contact upper surfaces of the contacting parts 62*a* and 72*a* and the sandwiching portions 62*b* and 72*b*. As a result, as shown in FIG. 4, an intermediate product in which the first conductive terminal 60 and the second conductive terminal 70 are fixed in a caulking manner to the lower case 50, is produced.

Next, in a third step, the intermediate product produced in the second step, the piezoelectric vibrating plate 20, and the upper case 40 are prepared, and these three members are assembled as shown in FIG. 2 and FIG. 7. The piezoelectric vibrating plate 20 is, for example, produced by joining the piezoelectric body 22 where the electrode 22*a* is formed to the vibrating plate 24. The piezoelectric body 22 and the vibrating plate 24 may be joined by adhering the two with the likes of an epoxy adhesive agent, for example, but the piezoelectric body 22 and the vibrating plate 24 are joined by any method.

In the third step, first of all, the terminal tips 62*ca* and 72*ca* of the first conductive terminal 60 and the second conductive terminal 70 in the prepared intermediate product are coated with a conductive adhesive agent. Next, the piezoelectric vibrating plate 20 is brought close from above the intermediate product and placed in the lower case step part 51 of the lower case 50, further, the upper case 40 is brought close to the lower case 50 from above the piezoelectric vibrating plate 20, and the engaging parts 46*a* and 46*b* are engaged with the guide parts 56*a* and 56*b* of the lower case 50 as shown in FIG. 7, thereby assembling the upper case 40 and the lower case 50.

Note that prior to assembly of the upper case 40 and the lower case 50, at least one of an upper surface side of the vibrating plate outer circumferential portion 24*a* and the contact projection 45 of the upper case 40 may be coated with a resin such as silicone. In this case, after the third step, a sealing resin 80 as shown in FIG. 8 is arranged on the contact portion between the piezoelectric vibrating plate 20 and the contact projection 45 by curing applied silicone with heating. This sealing resin 80 can prevent the problem of a gap being formed between the piezoelectric vibrating plate 20 and the contact projection 45, and the problem of the piezoelectric sounding body 10 becoming unable to generate a desired sound.

In a fourth step, an edge of the case caulking projection 56 is heated and thereby deformed so as to be larger than a diameter of the insertion holes 46*aa* and 46*ba* formed in the engaging parts 46*a* and 46*b*, whereby the upper case 40 is fixed to the lower case 50. Moreover, when the upper case 40 is fixed to the lower case 50, the piezoelectric vibrating plate 20 is sandwiched by the upper case 40 and the lower case 50 and fixed to the case 30. Furthermore, by the conductive adhesive agent coated on the terminal tips 62*ca* and 72*ca* of the first conductive terminal 60 and the second conductive terminal 70 being cured after being brought into contact with the piezoelectric vibrating plate 20, the terminal tips 62*ca* and 72*ca* and the piezoelectric vibrating plate 20 are connected.

After going through such steps, the piezoelectric sounding body 10 shown in FIG. 1 is manufactured. Note that a step in which parts of the second terminal portions 64 and 74 in the first conductive terminal 60 and second conductive terminal 70 are bent upwards to configure the lateral part 64*b* shown in FIG. 1 may be performed at the end of the first step, and moreover, may be performed in the second through fourth steps performed after the first step.

The piezoelectric sounding body 10 fixes the upper case 40 and the lower case 50 in a caulking manner to hold the piezoelectric vibrating plate 20 by sandwiching it between the upper case 40 and the lower case 50 (see FIG. 7). The piezoelectric sounding body 10 has a high reliability because a holding state of the piezoelectric vibrating plate 20 by the case 30 is hardly changed even in the environment where vibration is frequently added or the environment where temperature variation is large. Also, the contact projection 45 of the upper case 40 presses the piezoelectric vibrating plate 20 toward the lower case 50, and the upper case lower surface 48 is positioned with space to the piezoelectric vibrating plate 20 or the lower case 50. This configuration allows the piezoelectric sounding body 10 to press the contact projection 45 against the piezoelectric vibrating plate 20, prevent space from occulting between the contact projection 45 and the piezoelectric vibrating plate 20, and improve sealing property of the contact portion between the contact projection 45 and the piezoelectric vibrating plate 20.

As shown in FIG. 8, in the piezoelectric sounding body 10, the lower opening 46*ab* of the insertion hole 46*aa* inserted by the caulking projection 56 is formed on the upper case lower surface 48 positioned with space to the lower case 50 or the piezoelectric vibrating plate 20. Thus, a fixing force of the caulking fixing pressing the upper case 40 toward the lower case 50 is not directly transmitted from the upper case lower surface 48 around the insertion hole 46*aa* to the lower case 50, but is transmitted to the piezoelectric vibrating plate 20 and the lower case 50 via the contact projection 45 next to the upper case lower surface 48. Thus, a fixing force of the caulking fixing preferably acts in the direction where the contact projection 45 presses the piezoelectric vibrating plate 20 toward the lower case step part 51, and sealing property of the contact portion between the contact projection 45 and the piezoelectric vibrating plate 20.

As shown in FIG. 7, the insertion hole 46*aa* is positioned outside the contact projection 45 extending along the circumferential direction of the piezoelectric vibrating plate 20, and a fixing force of the caulking fixing is transmitted from outside the contact projection 45 to the contact projection 45 This allows the fixing force of the caulking fixing to preferably act in a direction where the piezoelectric vibrating plate 20 held is pressed, and improve sealing property of the contact portion between the contact projection 45 and the piezoelectric vibrating plate 20.

As shown in FIG. 8, in the piezoelectric sounding body 10, the space “a” between the first upper case lower surface 48*a* near the contact projection 45 and the lower case 50 is configured to be larger, and the space "b" between the second upper case lower surface 48*b* far from the contact projection 45 and the lower case 50 is configured to be smaller. This allows the second upper case lower surface 48*b* to act as a stopper, and a force can be acted with good balance on the contact portion between the contact projection 45 and the piezoelectric vibrating plate 20. Thus, the piezoelectric sounding body 10 can improve sealing property of the contact portion between the contact projection 45 and the piezoelectric vibrating plate 20.

As shown in FIG. 2 and FIG. 3, the piezoelectric sounding body 10 sandwiches part of the case 30 by the sandwiching portions 62*b* and 72*b* of the first and second conductive terminals 60 and 70 arranged on the inside of the case 30 and the second terminal portions 64 and 74 arranged on the outside of the case 30. In addition, the contacting part 62*a* and the sandwiching portion 62*b* arranged on both sides sandwiching the terminal insertion holes 54*a* and 54*b* are both supported by the lower case inner wall surface 52. As a result, an external force applied to the second terminal portions 64 and 74 is received by the case 30, and the problem of the conductive terminals 60 and 70 moving inside the case 30 by the external force can be prevented. Thus, in the piezoelectric sounding body 10, the problem of an electrical connection state between the piezoelectric vibrating plate 20 and the conductive terminals 60 and 70 deteriorating due to the conductive terminals 60 and 70 moving inside the case 30 by an external force, can be prevented. Moreover, even when an external force is applied, it is difficult for a fixed state of the conductive terminals 60 and 70 to the case 30 to change, and hence the piezoelectric sounding body 10 displays high reliability and durability performance.

Moreover, as shown in FIG. 2, the piezoelectric sounding body 10 has a shape that not only sandwiches the lower case 50 between the sandwiching portions 62*b* and 72*b* of the first terminal portions 62 and 72 and the downside parts 64*a* and 74*a* of the second terminal portions 64 and 74, but sandwiches the lower case 50 also between the third terminal portions 66 and 76 and the lateral part 64*b* of the second terminal portions 64 and 74. Thus, in the piezoelectric sounding body 10, many portions of the conductive terminals 60 and 70, such as the first terminal portions 62 and 72 excluding the contact-point parts 62*c* and 72*c*, the second terminal portions 64 and 74, and the third terminal portions 66 and 76, contact the case 30 from a variety of directions, and hence an external force applied to the second terminal portions 64 and 74 is preferably received by the case 30.

As shown in FIG. 3, in the piezoelectric sounding body 10, the contacting parts 62*a* and 72*a* extending in the same plane as the sandwiching portions 62*b* and 72*b* are fixed to the lower case inner wall surface 52, and hence an external force applied to the second terminal portions 64 and 74 can be preferably received by the lower case 50. Thus, the following problem can be prevented on the inside of the case 30, an external force is transmitted to a joining part of the contact-point parts 62*c* and 72*c* extending upwardly from the contacting parts 62*a* and 72*a* and the piezoelectric vibrating plate 20, and the joining part is thereby damaged. Moreover, since the contacting parts 62*a* and 72*a* are fixed in a caulking manner to the lower case 50, the lower case 50 and the contacting parts 62*a* and 72*a* are fixed with simplicity and high reliability.

As shown in FIG. 3, in the piezoelectric sounding body 10, the conductive terminals 60 and 70 are fixed in a caulking manner by the terminal caulking projections 57*a* and 57*b* being inserted into the plurality of fixing holes 62*aa* and 72*aa* formed in the contacting parts 62*a* and 72*a*, and hence the conductive terminals 60 and 70 can be effectively prevented from rotating due to an external force or the like. When attaching the conductive terminals 60 and 70 to the lower case 50, the conductive terminals 60 and 70 can be simply arranged in a correct position merely by inserting the terminal caulking projections 57*a* and 57*b* prior to having their tips deformed, into the fixing holes 62*aa* and 72*aa* of the contacting parts 62*a* and 72*a*, and hence this kind of piezoelectric sounding body 10 can be easily manufactured.

As shown in FIG. 5, in the piezoelectric sounding body 10, the contact-point parts 62*c* and 72*c* of the conductive terminals 60 and 70 have a shape that becomes narrower toward the terminal tips 62*ca* and 72*ca*. Thus, the contact-point parts 62*c* and 72*c* have a high flexibility, and conduction can be secured in a state where vibration of the piezoelectric vibrating plate 20 is unhindered. Moreover, even in the case when an external force that was unable to be received by the case 30 has been transmitted to the contact-point parts 62*c* and 72*e*, the narrowed contact-point parts 62*c* and 72*c* elastically deform, whereby the external force can be prevented from being transmitted farther to the tip side than a deformed place, and the problem of damage, and so on, occurring in a joining portion between the contact-point parts 62*c* and 72*c* and the piezoelectric vibrating plate 20, can be prevented.

As shown in FIG. 5, in the piezoelectric sounding body 10, by the contact-point parts 62*c* and 72*c* extending in a direction intersecting the first direction, a length from the portion fixed in a caulking manner to the terminal tips 62*ca* and 72*ca* can be increased, whereby appropriate springiness can be provided to the contact-point part 62*c*. Moreover, the problem of the terminal caulking projections 57*a* and 57*b* interfering with a movable range of the contact-point parts 62*c* and 72*c* to cause a defective product, can be reduced.

As shown in FIG. 6, the third terminal portions 66 and 76 of the conductive terminals 60 and 70 have formed therein the through hole 66*a* corresponding to a shape of the sandwiching portions 62*b* and 72*b*, and such conductive terminals 60 and 70 can be easily formed by mechanically processing a single metal plate. Such conductive terminals 60 and 70 do not have a joining portion resulting from the likes of welding or adhesion, hence have high strength and excellent durability.

As above, the piezoelectric sounding body according to the present invention was described showing an embodiment. However, the technical scope of the present invention is not limited to the piezoelectric sounding body 10 according to the embodiment, and it goes without saying that various modified examples altering the configuration of part of the piezoelectric sounding body 10 are also included in the technical scope of the invention. For example, shapes of the upper case 40 and the lower case 50, shapes of the conductive terminals 60 and 70, the numbers and positions of the terminal caulking projections 57*a* and 57*b*, and so on, can be changed according to design conditions, and so on.

In addition, for example, relative positions of the first terminal insertion hole 54*a* and the terminal caulking projection 57*a* and relative positions of the second terminal insertion hole 54*b* and the terminal caulking projection 57*b* may be made different. In this case, formation positions of the fixing holes 62*aa* and 72*aa* in the conductive terminals 60 and 70 are also made different for the first conductive terminal 60 and the second conductive terminal 70, based on the relative positions of the terminal insertion holes 54*a* and 54*b* and the terminal caulking projections 57*a* and 57*b*. By adopting such a shape, the problem that during assembly, the first conductive terminal 60 and the second conductive terminal 70 end up being assembled arranged in a mistaken position, can be prevented.

DESCRIPTION OF THE NUMERALS

10 . . . piezoelectric sounding body
20 . . . piezoelectric vibrating plate
22 . . . piezoelectric body
22*a* . . . other electrode
24 . . . vibrating plate
30 . . . case
40 . . . upper case
42 . . . sound emitting hole
44 . . . cylindrical part
45 . . . contact projection
46*a*, 46*b* . . . engaging part
46*aa*, 46*ba* . . . insertion hole
48 . . . upper case lower surface
48*a* . . . first upper case lower surface
48*b* . . . second upper case lower surface
50 . . . lower case
50*a* . . . center
51 . . . lower case step part
52 . . . lower case inner wall surface
53 . . . lower case outer wall surface
53*a* . . . downside recess
53*b* . . . lateral recess
54*a*, 54*b* . . . terminal insertion hole
56 . . . case caulking projection
56*a*, 56*b* . . . guide part
57*a*, 57*b* . . . terminal caulking projection
58*a*, 58*b* . . . auxiliary caulking projection
59 . . . notch
60, 70 . . . conductive terminal
62, 72 . . . first terminal portion
62*a* . . . contacting part
62*aa*, 72*aa* . . . fixing hole
62*b* . . . sandwiching portion
62*c* . . . contact-point part
62*ca*, 72*ca* . . . terminal edge
64, 74 . . . second terminal portion
64*a* . . . downside part
64*h* . . . lateral part
66 . . . third terminal portion
66*a* . . . through hole
80 . . . sealing resin

The invention claimed is:

1. A piezoelectric sounding body, comprising:
a piezoelectric vibrating plate;
a case housing the piezoelectric vibrating plate;
a first conductive terminal electrically connected to one electrode in the piezoelectric vibrating plate; and
a second conductive terminal electrically connected to the other electrode in the piezoelectric vibrating plate,
wherein the case includes:
a lower case where the first conductive terminal and the second conductive terminal are fixed; and
an upper case configured to be fixed in a caulking manner to the lower case and to sandwich the piezoelectric vibrating plate between the upper case and the lower case, and
the upper case includes:
a contact projection configured to contact the piezoelectric vibrating plate and to press it toward the lower case; and
an upper case lower surface configured to face the piezoelectric vibrating plate or the lower case with respect to a pressing direction where the piezoelectric vibrating plate is pressed toward the lower case and be arranged with space to the piezoelectric vibrating plate or the lower case wherein
the upper case lower surface includes:
a first upper case lower surface configured to have part of an opening edge of a lower opening; and
a second upper case lower surface configured to have another part of the opening edge, to be positioned farther from the contact projection than the first upper case lower surface, and to have the space being narrower than that of the first upper case lower surface.

2. The piezoelectric sounding body according to claim 1, wherein
a sealing resin is arranged on a contact portion between the piezoelectric vibrating plate and the contact projection.

3. The piezoelectric sounding body according to claim 1, wherein
a plurality of insertion holes where a caulking projection for fixing the upper case in a caulking manner to the lower case is inserted is formed in the upper case and has the lower opening positioned on the upper case lower surface.

4. The piezoelectric sounding body according to claim 2, wherein
a plurality of insertion holes where a caulking projection for fixing the upper case in a caulking manner to the lower case is inserted is formed in the upper case and has the lower opening positioned on the upper case lower surface.

5. The piezoelectric sounding body according to claim 3, wherein
the contact projection extends along a circumferential direction of the piezoelectric vibrating plate and the plurality of insertion holes is positioned farther than the contact projection with respect to a center of the piezoelectric vibrating plate.

6. The piezoelectric sounding body according to claim 4, wherein
the contact projection extends along a circumferential direction of the piezoelectric vibrating plate and
the plurality of insertion holes is positioned farther than the contact projection with respect to a center of the piezoelectric vibrating plate.

7. A piezoelectric sounding body, comprising:
a piezoelectric vibrating plate;
a case housing the piezoelectric vibrating plate;
a first conductive terminal electrically connected to one electrode in the piezoelectric vibrating plate; and
a second conductive terminal electrically connected to the other electrode in the piezoelectric vibrating plate,
wherein the case includes:
a lower case where the first conductive terminal and the second conductive terminal are fixed; and
an upper case configured to be fixed in a caulking manner to the lower case and to sandwich the piezoelectric vibrating plate between the upper case and the lower case, and
the upper case includes:
a contact projection configured to contact the piezoelectric vibrating plate and to press it toward the lower case; and
an upper case lower surface configured to face the piezoelectric vibrating plate or the lower case with respect to a pressing direction where the piezoelectric vibrating plate is pressed toward the lower case and be arranged with space to the piezoelectric vibrating plate or the lower case wherein a plurality of Insertion holes where a caulking projection for fixing the upper case in a caulking manner to the lower case is inserted is formed in the upper case and has a lower opening positioned on the upper case lower surface, the caulking projection has a base connecting to the lower case and an upper edge being larger than a diameter of the insertion hole at upper side to the insertion hole.

* * * * *